United States Patent [19]

Matsumoto

[11] Patent Number: 5,489,446
[45] Date of Patent: Feb. 6, 1996

[54] DEVICE FOR FORMING SILICON OXIDE FILM

[75] Inventor: Shigeyuki Matsumoto, Atsugi, Japan

[73] Assignee: Canon Kabushiki Kaisha, Tokyo, Japan

[21] Appl. No.: 270,310

[22] Filed: Jul. 5, 1994

Related U.S. Application Data

[63] Continuation-in-part of Ser. No. 999,554, Dec. 31, 1992, abandoned, which is a continuation of Ser. No. 618,586, Nov. 28, 1990, abandoned, which is a continuation of Ser. No. 414,572, Sep. 29, 1989, abandoned, which is a continuation of Ser. No. 154,884, Feb. 11, 1988, abandoned.

[30] Foreign Application Priority Data

Feb. 16, 1987 [JP] Japan ................... 62-34058

[51] Int. Cl.⁶ .................................................. C23C 16/00
[52] U.S. Cl. ....................... 427/255.3; 118/715; 118/724; 118/725
[58] Field of Search ............................ 118/715, 724, 118/725; 427/255.3

[56] References Cited

U.S. PATENT DOCUMENTS

| | | | |
|---|---|---|---|
| 4,133,704 | 1/1979 | MacIver | 437/247 |
| 4,139,658 | 2/1979 | Cohen | 437/239 |
| 4,168,998 | 9/1979 | Hasegawa | 118/719 |
| 4,223,048 | 9/1980 | Engle | 427/39 |

FOREIGN PATENT DOCUMENTS

| | | | |
|---|---|---|---|
| 54-144867 | 12/1979 | Japan . | |
| 57-18328 | 1/1982 | Japan . | |
| 58-42239 | 3/1983 | Japan . | |
| 58-173837 | 10/1983 | Japan . | |
| 62-18039 | 1/1987 | Japan | 118/725 |

OTHER PUBLICATIONS

Maliakal, Solid State Technology, Dec. 1984, pp. 105–109.
Wolf, Silicon Processing For the VLSI Era, vol. 1, Lattice Press© 1986 pp. 30–31 and 230–233.

*Primary Examiner*—Richard Bueker
*Attorney, Agent, or Firm*—Fitzpatrick, Cella, Harper & Scinto

[57] ABSTRACT

A device for forming a silicon oxide film comprises a quartz tube housing a substrate comprised of silicon, means for heating internally said quartz tube and means for delivering and flowing hydrogen gas and oxygen gas into said quartz tube to effect hydrogen combustion, wherein the gas introducing holes for selectively delivering and flowing either one of said gases are arranged in the neighborhood to each other while facing each other.

4 Claims, 1 Drawing Sheet

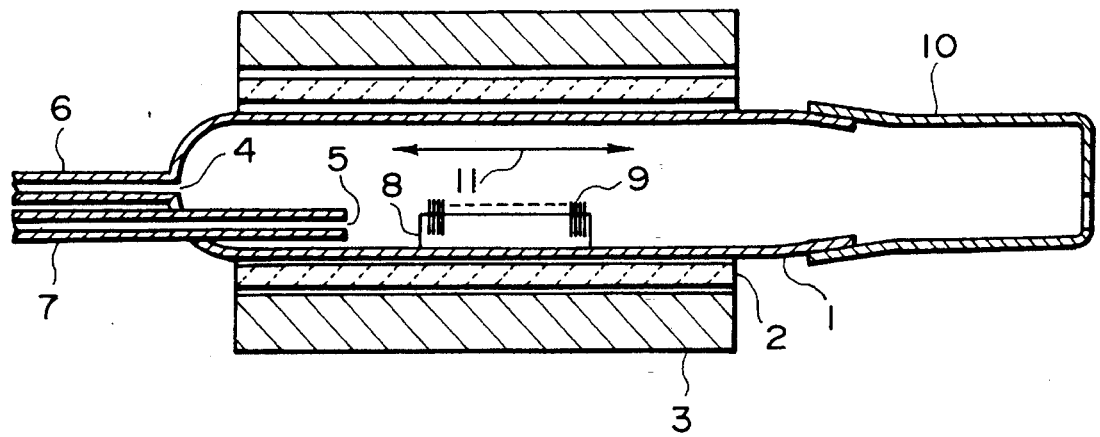
F I G. 1
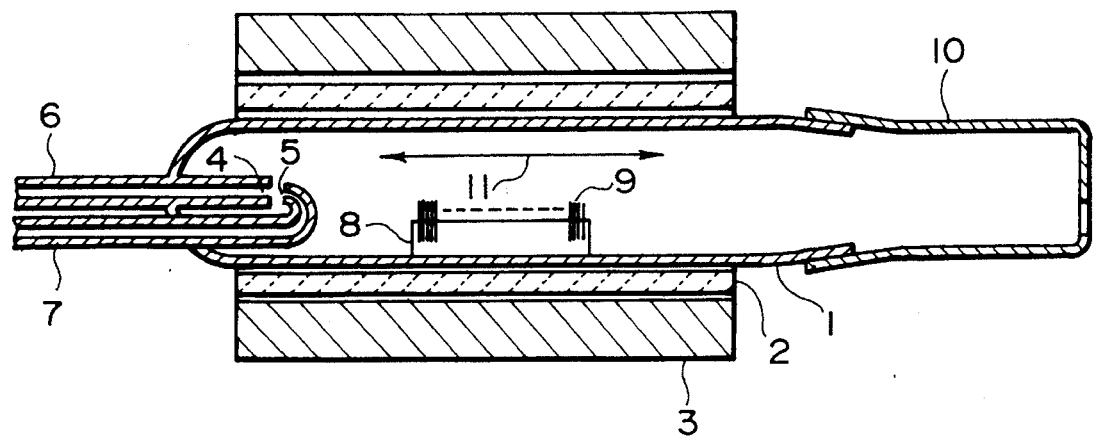
F I G. 2

DEVICE FOR FORMING SILICON OXIDE FILM

This application is a continuation-in-part of application Ser. No. 07/999,554, filed Dec. 31, 1992, now abandoned, which is a continuation of application Ser. No. 07/618,586, filed Nov. 28, 1990, now abandoned, which is a continuation of application Ser. No. 07/414,572, filed Sep. 29, 1989, now abandoned, which is a continuation of application Ser. No. 07/154,884, filed Feb. 11, 1988, which is now abandoned.

BACKGROUND OF THE INVENTION

1. Field of the Invention

This invention relates to a silicon oxide film forming technique which is intended to improve yield, quality, uniformity during formation of a silicon oxide film on a silicon surface.

2. Related Background Art

Silicon oxide film forming methods may include the thermal oxidation method, the vacuum deposition method, the CVD method, etc., and generally the thermal oxidation method has been utilized. The thermal oxidation method comprises heating a silicon substrate in an oxidative atmosphere to a predetermined high temperature, thereby forming a film of silicon oxide on the surface of the substrate.

The device for forming a silicon oxide film by the thermal oxidation method of the prior art is constituted of a heating portion 3, a uniform heating tube portion 2 and a quartz tube portion 1, as shown in FIG. 1, and has a structure capable of introducing various gases into the quartz tube portion 1. In the device of the prior art shown in FIG. 1, a plural number of gas introducing pipes are connected to the quartz tube portion. That is, an oxygen gas introducing hole is positioned at the end of the quartz tube and an hydrogen gas introducing hole is positioned in a high temperature region in the quartz tube away from the oxygen gas introducing hole so that the hydrogen gas supplied may be efficiently subjected to combustion in a short time and that stable combustion with little change in the spread of the flame may be obtained.

In the prior art, oxygen gas is flowed through the introducing pipe 6 to fill internally the quartz tube portion 1 with oxygen atmosphere and, 2 to 5 minutes later, hydrogen gas is flowed through the introducing pipe 7 for combustion. At that time, the surface of the substrate made of silicon 9 located within the quartz tube is oxidized with the flow of the water vapor generated. In this case, it is generally practiced to control the oxide film thickness by temperature and time.

However, in the prior art device as described above, the mixing of hydrogen gas and oxygen gas cannot be sufficient, and the water vapor stream also tends to be nonuniform. Therefore, the device had the problems such as nonuniformity of silicon oxide film thickness within the plane of a wafer, and difference in silicon oxide film thickness between the front portion and the rear portion within the quartz boat, and great variance relative to a desired value, etc. The present inventor has discovered nonuniformity of the silicon oxide film thickness results from the fact that the hydrogen gas introducing hole is distant from the oxygen gas introducing hole.

SUMMARY OF THE INVENTION

The present invention has been accomplished in view of the problems of the prior art as described above, and its object is to provide a silicon oxide film forming device, capable of stably forming a silicon oxide film the thickness of which is uniform within the wafer plane, and does not depend on the position of the wafer located within the quartz boat and is also small in variance relative to a desired value.

According to the present invention, there is provided a device for forming a silicon oxide film comprising a quartz tube housing a substrate comprised of silicon, means for internally heating said quartz tube and means for delivering and flowing hydrogen gas and oxygen gas into said quartz tube to effect hydrogen combustion, wherein the gas introducing holes for selectively delivering and flowing either one of said gases are arranged adjacent to each other as well as facing each other.

BRIEF DESCRIPTION OF THE DRAWINGS

FIG. 1 is a drawing for illustration of the prior art and FIG. 2 is a drawing showing an example of the present invention.

DESCRIPTION OF THE PREFERRED EMBODIMENTS

The present invention is described below by referring to FIG. 2.

The silicon oxide film forming device according to the present invention, as shown in FIG. 2, is constituted of a heater portion 3 to act as a means for heating the quartz tube 1 and controlling the heated temperature, a uniform heating tube portion 2 for expanding uniformly expending during heating of the quartz tube 1 in the diameter direction and the axial direction, a quartz boat 8 in which is located the silicon substrate 9 thereon and a quartz cap 10 for preventing entrainment of the outer air.

The above quartz tube 1 is provided with gas introducing pipes 6, 7, and has a structure which can permit predetermined gases to flow selectively through the gas introducing holes 4, 5 by opening of the valve not shown.

Here, the gas introducing holes 4, 5 should desirably be adjacently positioned within a distance of 450 mm or less in order to effect hydrogen combustion efficiently and uniformly to generate a uniform water vapor stream.

The quartz tube 1, because its degree of cleanness influences the film quality of the silicon oxide film, is constantly under flow of a gas of high purity through the gas introducing hole 4.

Further, the silicon substrate 9 on which the silicon oxide film is formed is located in plural sheets on the quartz boat 8, which are to be moved toward the uniform heating portion 11 of the quartz tube 1 through a soft landing mechanism, etc.

In the present invention, prior to forming a silicon oxide film, the quartz tube 1 is previously filled internally with nitrogen atmosphere delivered and flowed through the gas introducing pipe 6. Therefore, no fragile silicon oxide film with low packing density which will be formed in oxygen atmosphere will be formed.

The substrate made of silicon 9 and the quartz boat 8, after located at the predetermined positions, are left to stand for 30 seconds to 5 minutes until the temperature becomes uniform.

Then, by opening the valve not shown, oxygen gas is delivered through the gas introducing pipe 6, the gas introducing hole 4 and hydrogen gas through the gas introducing pipe 7 and the gas introducing hole 5, into the quartz tube 1, where combustion is effected.

According to the present invention, since the gas introducing holes 4, 5 are arranged adjacently and also both are opposed to each other, hydrogen gas and oxygen gas are delivered and flowed in opposite directions. Accordingly, both gases can be mixed sufficiently to efficiently effect hydrogen combustion, thereby making water vapor uniform.

For this reason, a silicon oxide film with a uniform film thickness within the wafer plane, within a batch and between batches can be formed with good reproducibility.

The conditions and procedures used for practicing the present invention are shown below.

The substrate formed of silicon 9 is left to stand in the quartz tube 1 filled with a nitrogen atmosphere, and after uniform heating thereof at a predetermined temperature, delivery of nitrogen is stopped for making hydrogen gas readily combustible, and oxygen at 2 to 8 l/min. and hydrogen at 1 to 5 l/min. are flowed at the same time.

During that operation, the inner temperature of the quartz tube 1 should be desirably 800° to 900° C. for a thin oxide film, and 900° to 1100° C. for a thick oxide film, for the purpose of lowering the Si-SiO$_2$ interface level. The film thickness is controlled by the time of hydrogen combustion effected by delivering and flowing hydrogen and oxygen. Also, for lowering stably the interface level, after termination of hydrogen combustion, nitrogen is flowed at 2 to 8 l/min. to complete formation of a silicon oxide film.

The condition for practicing the present invention is not limited to the range set forth above.

The present invention will be described below by referring to an example.

EXAMPLE

A substrate made of silicon was set in a quartz tube filled with nitrogen atmosphere. The quartz tube was heated internally to 850° C. and allowed to stand for 3 minutes to effect uniform heating. Next, introduction of nitrogen was stopped, and oxygen at 2 l/min. through the gas introducing hole 4 and hydrogen at 3 l/min. through the gas introducing hole 5 were introduced into the quartz tube in opposite flowing directions with a distance of 400 mm between the introducing holes 4, 5 to effect hydrogen combustion. Generation of water vapor by hydrogen combustion was continued for 10 minutes and then stopped, thereby completing formation of a silicon oxide film. Then, only nitrogen was flowed into the quartz tube at a flow rate of 5 l/min. for 20 minutes.

The silicon oxide film obtained in this example had a uniform thickness throughout the whole surface of wafer. Furthermore, the silicon oxide film formed also had a uniform thickness within batch and between batches.

The uniformity of the thickness of the silicon oxide film obtained in the example was compared with that of a silicon oxide film obtained by use of the prior art device as shown in FIG. 1 with respect to average film thickness and 3σ (σ is the standard deviation). The silicon oxide film by use of the prior art device was formed with the same treating temperature (850° C.), supplied gas amounts (hydrogen:3 l/min. oxygen:2 l/min.) and treating time as those in the example.

The film thickness was measured at 33 points within the wafer surface including the center and other 32 points on two lines perpendicularly crossing at the center with a pitch of 5 mm within 40 mm from the center, and uniformity was evaluated by statistical process. The results are shown in Table 1.

TABLE 1

Distribution of silicon oxide film thicknesses within surface (Desired film thickness: 200 Å)

| Gas inflow direction and distance between gas introducing holes | Same direction 500 mm (Prior art) | | Opposite direction 400 mm (Example) | |
|---|---|---|---|---|
| | Average film thickness | 3σ | Average film thickness | 3σ |
| First time | 195Å | 13Å | 202Å | 8Å |
| Second time | 201Å | 9Å | 196Å | 10Å |
| Third time | 199Å | 11Å | 198Å | 6Å |

As described above, the silicon oxide film forming device in accordance with the present invention can stably supply with good reproducibility a silicon oxide film which has a uniform thickness within the wafer surface as compared with the prior art device.

I claim:

1. A device for forming a silicon oxide film on a silicon substrate comprising:

a quartz tube in which said substrate is housed;

means for delivering hydrogen gas and oxygen gas into said quartz tube to effect hydrogen combustion, including gas introducing holes for providing either of said gases, said gas introducing holes arranged adjacent and in opposition to each other and positioned at a distance of 450 mm or less from each other; and a heating element for internally heating said quartz tube, said heating element surrounding said gas introducing holes.

2. The device according to claim 1, further including gas introducing pipes each having one of said gas introducing holes, said gas introducing pipes being arranged substantially parallel to each other at the one end of the quartz tube and an end portion of one of the gas introducing pipe being bent so as to position the gas introducing holes adjacent and in opposition to each other.

3. A method for forming a silicon oxide film on a silicon substrate in a reaction chamber, comprising:

heating said reaction chamber to a temperature sufficient to generate steam from a mixture of oxygen gas and hydrogen gas by use of a heating element;

introducing oxygen gas and hydrogen gas into said reaction chamber to generate steam using a gas introducing conduit system, said gas introducing conduit system including an oxygen gas introducing conduit having an outlet and a hydrogen gas introducing conduit having an outlet, said outlets positioned in opposition to each other so as to create a sufficient mixture of the oxygen gas and hydrogen gas to generate said steam said heating element surrounding said outlets; and effecting the formation of said silicon oxide film by bringing said steam into contact with said silicon substrate.

4. A device for forming a silicon oxide film on a silicon substrate comprising:

a quartz tube having a quartz boat in which said substrate is housed;

a quartz cap at one end of the quartz tube for preventing entry of the outer air:

means for delivering hydrogen gas and oxygen gas into said quartz tube to effect hydrogen combustion; including gas introducing holes for providing either of said gases, said gas introducing holes arranged adjacent and in opposition to each other; and a heating element for internally heating said quartz tube, said heating element surrounding said gas introducing holes.

* * * * *